United States Patent
Cina et al.

(10) Patent No.: US 8,895,155 B2
(45) Date of Patent: Nov. 25, 2014

(54) ORGANIC LIGHT-EMITTING DIODE HAVING DOPED LAYERS

(75) Inventors: Salvatore Cina, Rennes (FR); Benoit Racine, Renage (FR); Christophe Fery, Niedereschach (DE)

(73) Assignee: Thomson Licensing, Boulogne-Billancourt (FR)

( * ) Notice: Subject to any disclaimer, the term of this patent is extended or adjusted under 35 U.S.C. 154(b) by 1407 days.

(21) Appl. No.: 11/667,646

(22) PCT Filed: Nov. 24, 2005

(86) PCT No.: PCT/EP2005/056196
§ 371 (c)(1),
(2), (4) Date: Dec. 5, 2007

(87) PCT Pub. No.: WO2006/056586
PCT Pub. Date: Jun. 1, 2006

(65) Prior Publication Data
US 2008/0118724 A1    May 22, 2008

(30) Foreign Application Priority Data
Nov. 29, 2004 (FR) .................................... 04 52802

(51) Int. Cl.
*H01L 51/54* (2006.01)
*H01L 51/50* (2006.01)

(52) U.S. Cl.
CPC ..... *H01L 51/5012* (2013.01); *H01L 2251/5315* (2013.01); *H01L 51/5032* (2013.01); *H01L 51/5052* (2013.01); *Y10S 428/917* (2013.01)
USPC ........... 428/690; 428/917; 313/504; 313/506; 257/40; 257/101

(58) Field of Classification Search
CPC ............ H01L 51/0579; H01L 51/0051; H01L 51/5052; H01L 51/506; H01L 51/5076; H01L 2251/552; H01L 2251/554

USPC .................................................. 257/E51.009
See application file for complete search history.

(56) References Cited

U.S. PATENT DOCUMENTS

| 5,674,597 | A | 10/1997 | Fujii et al. |
| 6,420,055 | B1 * | 7/2002 | Ueda et al. ..................... 428/690 |
| 6,472,817 | B1 * | 10/2002 | Kawase ......................... 313/504 |
| 6,566,807 | B1 * | 5/2003 | Fujita et al. .................... 313/506 |
| 2002/0055015 | A1 | 5/2002 | Sato et al. |
| 2002/0071963 | A1 * | 6/2002 | Fujii ............................. 428/690 |
| 2002/0086180 | A1 * | 7/2002 | Seo et al. ....................... 428/690 |
| 2003/0111666 | A1 | 6/2003 | Nishi et al. |
| 2003/0143428 | A1 | 7/2003 | Kim et al. |
| 2004/0265630 | A1 | 12/2004 | Suh et al. |
| 2005/0110009 | A1 * | 5/2005 | Blochwitz-Nimoth et al. 257/40 |

FOREIGN PATENT DOCUMENTS

| EP | 0498979 | 8/1992 |
| EP | 1017118 A2 | 7/2000 |
| EP | 1347518 | 9/2003 |
| JP | 2002-352961 | 4/2003 |

OTHER PUBLICATIONS

Patent Abstracts of Japan, vol. 2003, No. 4, Apr. 2, 2003 (and JP 2002-352961 REF. AH).
Search Report Dated Mar. 8, 2006.
Patel et al., "High-Efficiency Organic Light-Emitting Diodes", IEEE Journal on Selected Topics in Quantum Electronics, vol. 8, No. 2, Mar./Apr. 2002, pp. 346-361.

\* cited by examiner

*Primary Examiner* — Michael H Wilson
(74) *Attorney, Agent, or Firm* — Robert D. Shedd; Jeffrey M. Navon

(57) ABSTRACT

Organic light-emitting diode comprising a lower electrode and an upper electrode, an organic electroluminescent layer and at least one doped organic layer in contact with one of said electrodes. According to the invention, the doping level of this organic layer is higher at the interface with the electrode than in the core of this layer. Thanks to the invention, the luminous efficiency of the diode is very substantially improved.

6 Claims, 3 Drawing Sheets

ORGANIC LIGHT-EMITTING DIODE HAVING DOPED LAYERS

This application claims the benefit, under 35 U.S.C. §365 of International Application PCT/EP2005/056196, filed Nov. 24, 2005, which was published in accordance with PCT Article 21(2) on Jun. 1, 2006 in French and which claims the benefit of French patent application No. 0452802, filed Nov. 29, 2004.

The invention relates to an organic light-emitting diode comprising:
a substrate,
a lower electrode of a first kind on the same side as the substrate and an upper electrode of a second kind on the opposite side to the substrate, the electrode kinds corresponding to anode and cathode,
an organic emissive electroluminescent layer that is inserted between the lower electrode and the upper electrode,
and at least one doped organic layer in contact with one of said electrodes, which layer is inserted between this electrode and said electroluminescent layer and is doped with a donor dopant if said electrode in contact with it is a cathode and/or with an accepter dopant if said electrode in contact with it is an anode.

The invention also relates to illuminating panels or image display screens comprising an array of these diodes belonging to the same substrate.

As document EP 0 498 979 (Toshiba) teaches—see page 2—, such a doped organic layer allows electrical charges to be injected and transported between the electrode with which it is in contact and the electroluminescent layer with a much lower electrical resistance than by using an undoped organic injection layer and an undoped organic transport layer. The supply voltage for the diodes of this type is therefore substantially lowered and their luminous efficiency improved.

The advantage of using doped organic layers for injecting and transporting charges—electrons or holes—in the electroluminescent emissive layer, instead of charge injection and transport layers of the prior art, is two fold, namely both:
a lowering of the charge injection barrier and
a reduction in the ohmic losses in the charge injection and transport layers, since these layers have a high conductivity owing to the doping.

These two known advantages therefore rely on doping the organic layers that serve for injecting and transporting the charges. However, it is difficult to find a material doping level that enables both the desired injection properties and the desired transport properties to be optimized at the same time.

One object of the invention is to provide a means for optimizing these two advantages.

For this purpose, the subject of the invention is an organic light-emitting diode comprising:
a substrate,
a lower electrode of a first kind on the same side as the substrate and an upper electrode of a second kind on the opposite side to the substrate, the electrode kinds corresponding to anode and cathode,
an organic emissive electroluminescent layer that is inserted between the lower electrode and the upper electrode,
and at least one doped organic layer in contact with one of said electrodes, which layer is inserted between this electrode and said electroluminescent layer and is doped with a donor dopant if said electrode in contact with it is a cathode and/or with an accepter dopant if said electrode in contact with it is an anode,
in which diode the level of doping of at least one doped organic layer is higher at the interface between this organic layer and the electrode with which this layer is in contact than in the core of this doped organic layer.

More precisely, the layer in contact with one of said electrodes is an organic material doped with a donor dopant if said contacting electrode is a cathode and/or with an acceptor dopant if said contacting electrode is an anode. The term "donor dopant" or "n-dopant" is understood to mean a dopant that is capable of increasing the density of electron energy levels near the LUMO level of this material, while the term "acceptor dopant" or "p-dopant" is understood to mean a dopant that is capable of increasing the density of hole energy levels near the HOMO level of this material. Thanks to this doping, there is therefore charge transfer between the "host" organic material and the dopant—transfer of electrons from the dopant into the host material in the case of n-doping of this host material and transfer of electrons from the host material into the dopant in the case of p-doping of this host material. In order for this charge transfer to be able to take place, the potential barrier for this transfer must be limited. Thus, it is preferable, if the electrode in contact with the doped layer is a cathode, for the difference in absolute value between, on the one hand, the HOMO level energy or ionization potential of the donor dopant and, on the other hand, the LUMO level energy of the organic material of the doped layer to be less than 5 eV, and/or, if the electrode in contact with the doped layer is an anode, it is preferable for the difference in absolute value between, on the one hand, the LUMO level energy or electron affinity of the acceptor dopant and, on the other hand, the HOMO level energy of the organic material of the doped layer to be less than 5 eV. By convention, the energies of the HOMO or LUMO levels are counted here as being positive relative to the vacuum energy level of an electron. To ensure better charge transfer this time between the doped layer and the electrode with which it is in contact, it is furthermore desirable, if the electrode in contact with the doped layer is a cathode, for the HOMO level energy or ionization potential of the donor dopant to be higher than the LUMO level energy of the organic material of the doped layer and/or, if the electrode in contact with the doped layer is an anode, for the LUMO level energy or electron affinity of the acceptor dopant to be equal to or lower than the HOMO level energy of the organic material of the doped layer.

The definition according to the invention of the dopants therefore does not cover what is given in document EP 1 347 518, in which the doping consists of a "dispersion" of an inorganic semiconductor compound in an organic matrix, this dispersion character therefore having the purpose of increasing the area of contact between the organic material and the inorganic compound (see page 6, line 12 of that document).

The definition according to the invention of the dopants would not moreover result in the material of the buffer layer described in document US 2003/143428. According to that document, this material is formed by mixing an organic compound with an alkali or alkaline-earth metal compound (see §23), this mixture having a concentration gradient of its two components. The buffer layer described is directly in contact with an electrode, here a cathode, and therefore only n-type doping (donor dopant) is considered. The buffer layer may be directly in contact with the emissive electroluminescent layer (see §42), but in no case here is it an n-doped layer within the meaning of the invention. This is because, even if the alkali or alkaline-earth metal compounds of the mixture of this layer are commonly used as n-dopants (donors), the other component (the organic compound) of the mixture is not capable of being n-doped within the meaning of the invention, especially as regards "starburst"-type organic compounds as mentioned in that document. This is because the HOMO level of the n-dopants considered here is too far away, i.e. by more than 0.5 eV, from the LUMO levels of these organic compounds that make up the mixture, especially if they are starburst compounds. Such compounds comprise amine functional groups that give lone electron pairs that would be an obstacle to effective n-doping within the meaning of the invention. This is also why, except in that document, these starburst compounds are generally used as hole conductors and not as electron conductors.

In general, the invention relies in particular on the foregoing principle, whereby the doping level of the dopant of at least one doped organic layer is higher at the interface between this organic layer and the electrode with which this layer is in contact than in the core of this doped organic layer.

Thanks to a different level of doping at the interface with the electrode than in the core of the doped organic layer, it is possible to both reduce the thickness of the potential barrier at the interface and to increase the electrical resistance in the core of the material since the doping level is lower. This makes it possible to optimize both the charge injection properties and charge transport properties, for electrons or holes, of this doped layer. Preferably, a potential barrier of greater than 0.2 eV exists at said interface.

At room temperature, this interface therefore forms a Schottky junction. If said electrode at this interface is a cathode, if the material of the electrode at this interface is a metal having a work function $E_{M1}$, and if the material O1 of said organic layer n-doped with donors at this interface has a Fermi level $E_1$ and a LUMO (Lowest Unoccupied Molecular Orbital) level $E_{C1}$, then $|E_{C1}-E_{M1}|>0.2$ eV and $E_{M1}>E_1$ (the reverse condition $E_{M1}<E_1$ would on the contrary imply an ohmic contact). The method of electron injection at this interface is therefore the following: the electrons populating the "donor" levels near this interface pass into the metal M1, which is an infinite reservoir of charges, and the depopulation of the "donor" levels in the organic semiconductor material O1 near this interface gives rise to a local positive charge that forms a potential barrier at the interface, and the LUMO level $E_{C1}$ then has a curvature near this interface. The thickness of this barrier, which corresponds to the extent of this curvature, is of the order of a few nanometers. When a potential difference is applied to the diode in the conducting direction, in order to emit light, the electrons pass through this barrier by the tunnel effect.

More generally, it is also possible to define, for the doped organic material O1, the energy E1 of the Fermi level, and the energy $E_{V1}$ of the HOMO (Highest Occupied Molecular Orbital) level. The n-doping in donor levels of this material is reflected in: $E_1-E_{C1}<E_{V1}-E_1$.

If said electrode at this interface is an anode, if the material of the electrode at this interface is a metal having a work function $E_{M2}$, and if the material O2 of said organic layer p-doped with acceptors at this interface has a Fermi level $E_2$ and a HOMO level $E_{V2}$, then $|E_{V2}-E_{M2}|>0.2$ eV and $E_{M2}<E_2$ (the reverse condition $E_{M2}>E_2$ would on the contrary imply an ohmic contact). The method of injecting holes at this interface is therefore the following: the holes populating the "acceptor" levels near this interface pass into the metal M2, which is an infinite reservoir of charges, and depopulation of the "acceptor" levels in the organic semiconductor material O2 near this interface gives rise to a local negative charge that forms a potential barrier at the interface, and the HOMO level $E_{V2}$ then has a curvature near this interface. The thickness of this barrier, which corresponds to the extent of this curvature, is of the order of a few nanometers. When a potential difference is applied to the diode in the conducting direction, in order to emit light, the holes pass through this barrier by the tunnel effect.

More generally, it is also possible to define, for the doped organic material O2, the energy E2 of the Fermi level, and the energy $E_{C2}$ of the LUMO level. The p-doping in acceptor levels of this material is reflected by the relationship: $E_2-E_{C2}>E_{V2}-E_2$.

Preferably, the average conductivity of the material of said doped organic layer is at least three times higher in a 10 nm thick slice of this layer, located at the interface and in contact with said electrode, than in an at least 10 nm thick slice located in the core of this doped organic layer at more than 20 nm from said electrode.

The conductivity of this doped organic layer may be measured by a method similar to that described later for obtaining this doped organic layer, and especially by measuring the change in the resistance of this layer between two measurement electrodes while this layer is being etched: the resistance change for 10 nm etched in the core, that is to say more than 20 nm from the electrode of the diode, will then be at least three times lower than the resistance change for 10 nm etched near and in contact with the electrode of the diode.

Preferably, the average dopant concentration in the material of said doped organic layer is at least three times higher in a slice of this layer, located at the interface and in contact with said electrode, than in a slice located in the core of this doped organic layer at more than 10 nm from said electrode.

The thickness of the slices depends on the method of analysis used. Preferably, it is of the order of 10 nm. As method of analysis, it is possible to use, for example:
SIMS (Secondary Ion Mass Spectroscopy);
RBS (Rutherford Backscattering);
NRA (Nuclear Reaction Analysis).

To establish the dopant concentration gradient according to the invention using these methods, it may be necessary to prepare calibration specimens using a method known per se.

Preferably, the diode includes an organic blocking layer inserted between at least one doped organic layer and said electroluminescent layer, which blocks holes if said doped organic layer is in contact with a cathode and blocks electrons if said doped organic layer is in contact with an anode. According to a variant, the base material of this blocking layer is identical to that of the doped organic layer, in which case this material is not significantly doped in the thickness of said blocking layer.

Thus, if the material of the doped organic layer of the diode according to the invention has a dopant concentration gradient in the slice of this layer that is located between its interface with the electrode with which it is in contact and the core of this layer, conversely, in the opposite slice of this layer, which is located between its core and the boundary of this layer that is opposite this electrode, the concentration of this same dopant may be much lower or even zero so as, for example, to leave a slice of this layer for charge blocking. However, to retain the abovementioned advantage of low ohmic losses that is provided by the doped charge injection and transport layers in the diodes according to the invention, it is preferable if the dopant concentration in the material of this organic layer is zero or practically zero at the boundary of this layer opposite said electrode with which it is in contact, the thickness of the slice with a zero or practically zero concentration in this layer remains strictly less than the thickness of the slice with a non-zero dopant concentration. The slice with a non-zero concentration then includes the zone with a dopant concentration gradient. The layer with a zero dopant concentration obviously has a lower conductivity. By limiting its thickness, the ohmic losses may also be limited. However, it should be pointed out that, in document US 2003/111666, at least one of the charge injection and transport layers of the diodes described includes a doped slice in contact with an electrode and an undoped slice, itself generally in contact with a blocking layer (FIGS. 2B, 4B, 5, 6B, 7, 9A and 9B) if not directly in contact with the electroluminescent layer (slices referenced 915 and 932 in FIGS. 9A and 9B). In any case, in that document, the thickness of the undoped slice (generally 40 nm) is strictly greater than the thickness of the doped slice (at most 30 nm for the slices 916 and 931 in FIGS. 9A and 9B, if not 5 nm), which does not allow, contrary to the invention, low ohmic losses to be maintained.

Blocking layers are described in document EP 1 017 118 (Sharp), referred to here as "restraining layers". Such blocking layers serve to limit electron/hole recombinations outside the electroluminescent layer, so as to maintain a high luminous efficiency. Such blocking layers are particularly useful when the electroluminescent layer includes phosphorescent dopants that allow radiative recombination of electron/hole excitons, called "triplets", since these excitons have a lifetime that allows them to diffuse over several hundred nanometers, thereby making the electron or hole blocking even more useful for preventing nonradiative recombinations. The reader may for example refer to the article entitled "*High-Efficiency Organic Light-Emitting Diodes*", by N. K. Patel, S. Cina and J. H. Burroughes, in IEEE Journal on Selected Topics in Quantum Electronics", Vol. 8, No. 2, March-April 2002, pp. 346-361, which describes the importance of triplets and phosphorescent dopants for improving the luminous efficiency of organic light-emitting diodes.

The subject of the invention is also an illuminating panel or an image display screen comprising an array of diodes according to the invention, in which the diodes of this array are supported by the same substrate.

Preferably, said substrate is an active matrix comprising an array of drive/supply circuits.

Preferably, the lower electrodes of these diodes are cathodes. Each drive/supply circuit corresponds to one diode of the panel or screen and therefore includes a current-modulating n-type transistor connected in series with this diode.

The combination of this "reverse" structure and an n-type modulating transistor makes it possible for each transistor to drive a diode independently of the voltage drop across the terminals of this diode.

Preferably, the substrate includes a layer of semiconductor material made of amorphous silicon. Each modulating transistor then includes a portion of this silicon layer.

The invention will be more clearly understood on reading the following description, given by way of nonlimiting example and with reference to the appended figures in which.

Figure 1:
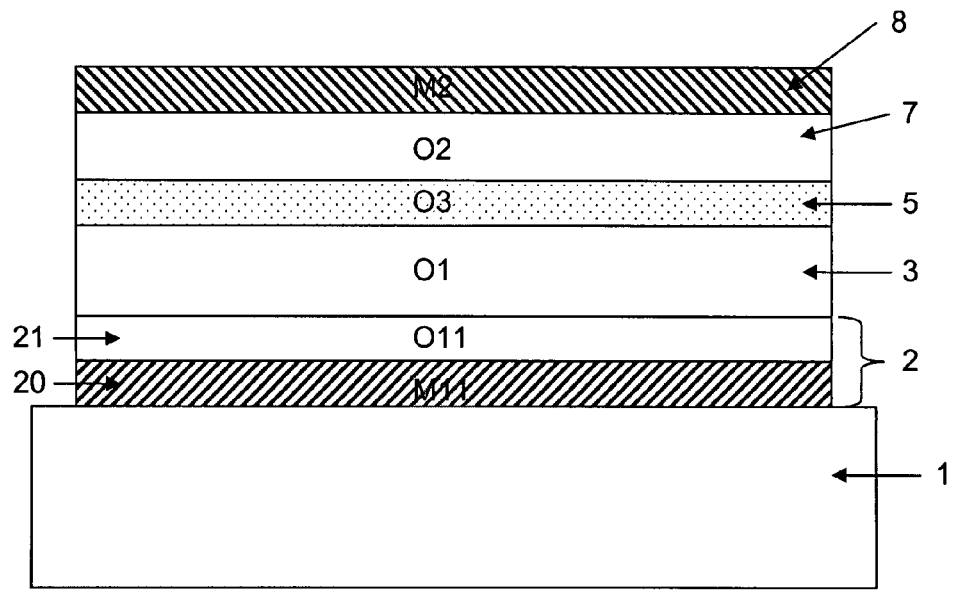
FIG. 1 illustrates a first embodiment of a diode according to the invention, which does not include blocking layers.

The fabrication of a diode according to a first embodiment of the invention will now be described with reference to FIG. 1.

A layer 20 of conductive material M11 is deposited on a glass substrate 1. This conductive material M11 is for example ITO (Indium Tin Oxide) deposited by vacuum sputtering.

A conductive planarizing layer 21 made of organic material O11, here PEDOT-PSS, is deposited on this layer 20. PEDOT-PSS is a mixture of PEDOT (poly-3,4-ethylene dioxythiophene) and PSS (polystyrene sulfonate), which is not recognized as being very suitable for transporting electrons since the work function of this material is relatively high (>5 eV). However, thanks to the high level of n-doping at the interface with the doped lower organic layer 3, described below, it is possible to inject electrons into it.

The stack of layers 20 and 21 forms here the lower electrode 2 serving in this case as cathode.

Figure 3:
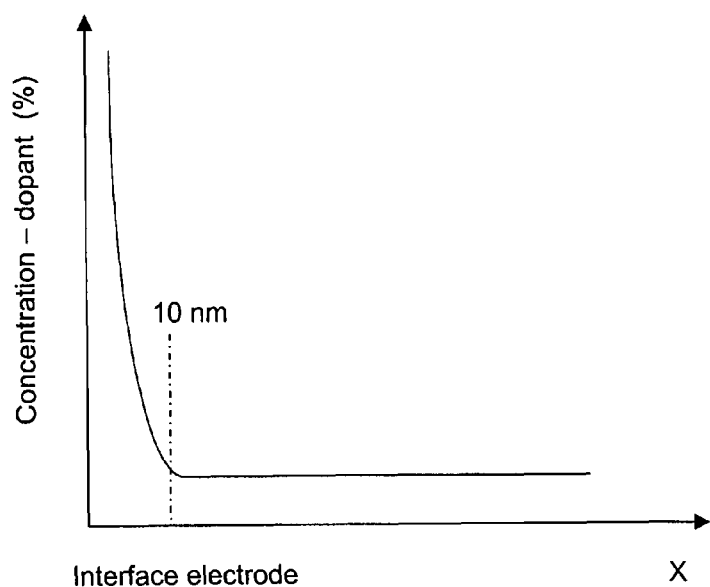
FIG. 3 illustrates the variation in dopant concentration in the doped organic layer in contact with the lower electrode of the diode of FIG. 1 or FIG. 2 as a function of the distance from the interface with this electrode.

A lower organic layer 3 made of n-doped material O1 is deposited on this bilayer electrode 2. According to the invention, the donor dopant concentration is much higher at the interface ($x=0$) with the electrode 2 than in the core of this material O1 ($x>0$), as illustrated by the curve in FIG. 3.

Preferably, this doping profile is adapted so that the conductivity of the material of the lower organic layer 3 is at least three times higher at the interface with this electrode 2 than in the core of this lower organic layer 3.

Figure 5:
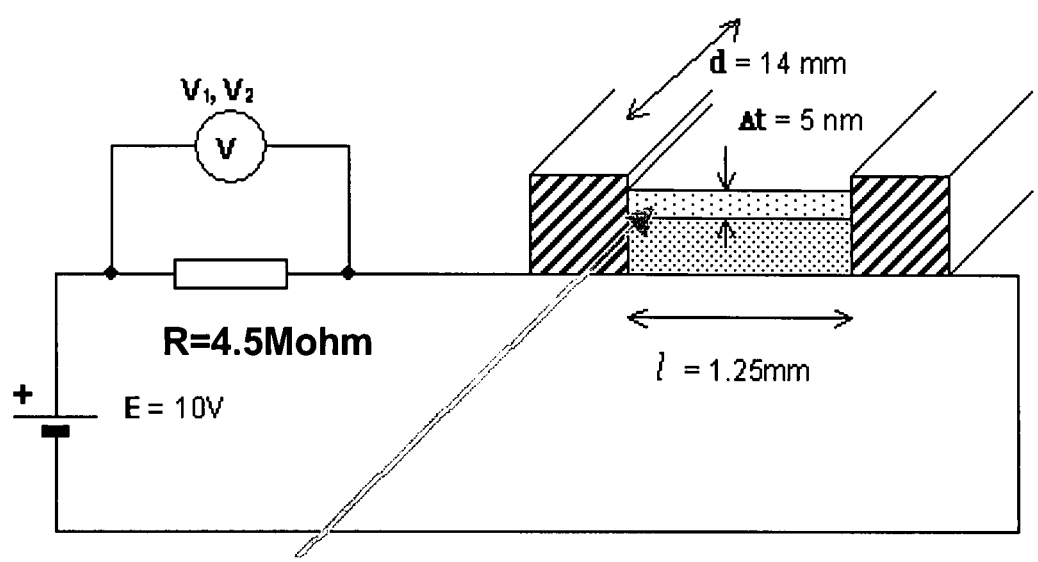
FIG. 5 illustrates schematically a circuit diagram for evaluating the surface conductivity relative to the conductivity in the core of an organic layer.

To ensure that this advantageous conductivity profile is achieved, the set-up shown in FIG. 5 is for example used, in which, in the deposition chamber, the material O1 is deposited between two metal electrodes (hatched section in the figure) that are separated by a distance $l=1.25$ mm, extending over a length $d=14$ mm, these electrodes being connected to a resistance meter. This meter comprises here a voltage generator, generating a DC voltage $E=10$ V and a reference resistor $R=4.5$ MΩ which are connected in series. Measurement of the voltage across the terminals of the reference resistor gives the value of resistance between the two electrodes. Any similar device may be used without departing from the scope of the invention.

To ensure that this advantageous conductivity profile is achieved, the proportion of dopant at the moment of O1 deposition is adapted so as to obtain:

a voltage change across the terminals of the reference resistor of 30 mV for a 10 nm thickness, for the first ten to twenty nanometers of the layer 3 deposited on the electrode 2; and a voltage change across the terminals of the reference resistor of only 12 mV for a 10 nm thickness, for the tens of nanometers deposited subsequently, which correspond in particular to the core of the layer 3.

Next, deposited on this doped lower organic layer 3, which was deposited using this doping calibration method, is an organic electroluminescent layer 5 of material O3. This material O3 is not generally doped with donor or acceptor elements, but is preferably doped with a fluorescent or phosphorescent dopant, as illustrated for example in the already mentioned IEEE Journal article "*High-Efficiency Organic Light-Emitting Diodes*".

An upper organic layer 7 of p-doped material O2 is deposited on this organic electroluminescent layer 5. Here, the acceptor dopant concentration is approximately constant over the entire thickness of this layer. In a variant, the acceptor dopant concentration is much higher at the interface with the electrode 8 that will cover it than in the core of this material O2.

A layer of metal M2, serving as upper electrode 8, here an anode, is deposited on this doped upper organic layer 7.

A diode according to the invention is thus obtained.

Thanks to the invention, increasing the doping of the doped organic layers at the interface with the electrode with which it is in contact makes it possible to substantially reduce the supply voltage required to obtain a predetermined current, and therefore a predetermined illumination, as the following example illustrates. The invention allows the luminous efficiency of organic light-emitting diodes to be considerably improved.

Figure 2:
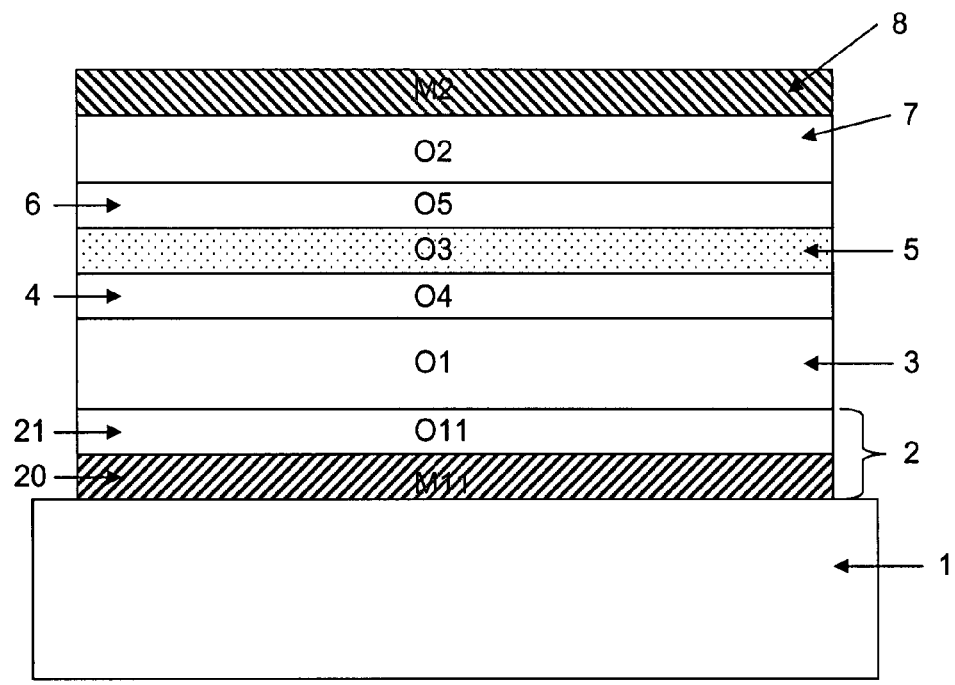
FIG. 2 illustrates a second embodiment of a diode according to the invention, which does include blocking layers.

The fabrication of a diode according to a second embodiment of the invention, as shown in FIG. 2, follows on from the description of the first embodiment. In this second embodiment, the following are interposed:

a hole-blocking layer 4 made of organic material O4 between the doped layer 3 and the electroluminescent layer 5; and an electron-blocking layer 6 made of organic material O5 between the electroluminescent layer 5 and the doped layer 7.

Thus, another diode according to the invention is obtained.

The invention also applies to illumination panels or image display screens comprising an array of such diodes.

The present invention has been described with reference to a diode comprising both a lower doped organic layer and an upper doped organic layer in which the lower electrode is a cathode and the upper electrode is an anode. However, it is obvious to a person skilled in the art that it can be applied to other types of diodes without departing from the scope of the appended claims.

The following example illustrates the invention.

The diode shown in this example has the same structure as that of the second embodiment of the invention that has just been described.

This diode has, going upwards from the substrate 1, the following layers:

a metallic layer 20 made of ITO with a thickness of about 150 nm;

a layer 21 made of PEDOT-PSS, from Bayer, with the trade name BAYTRON VPAI 4083 or BAYTRON VPCH 8000, having a thickness of 40 nm. This layer is advantageously produced by spin coating and ensures very good planarity, which is very advantageous for achieving good performance at the diode and for limiting the thickness and therefore the cost of the upper layers. It also contributes to the operation of the cathode, since here the PEDOT-PSS material is used in this case to transport electrons. The thickness of this layer may if required be substantially thicker;

a lower layer 3 made of 4,7-diphenyl-1,10-phenanthroline ("Bphen"), n-doped with cesium, having a thickness of 100 nm. The cesium doping level is adapted as described above so as to obtain, at the interface with the lower electrode, a conductivity three times higher than that obtained in the core of this layer. It is preferable for the doping level in the core of this layer to be low enough to limit the risk of cesium diffusion, which would run the risk of limiting the luminous efficiency in the electroluminescent layer 5, but also high enough to obtain a level of conductivity capable of limiting the ohmic losses in the diode;

a hole-blocking layer 4 made of undoped 4,7-diphenyl-1,10-phenanthroline (Bphen), with a thickness of 10 nm;

an electroluminescent layer 5 with a thickness of 20 nm, capable of emitting radiation of red color. The materials for this layer come from Covion, namely a product called in 2004 "TMM-004" doped to 20 wt % with a phosphorescent dopant called in 2004 "TER-004";

an electron-blocking layer 6 called "SPIRO TAD" from Covion, with a thickness of 10 nm;

an upper layer 7 made of "SPIRO TTB" (from Covion) p-doped to 2 wt % with the product called NDP2 from Novaled, with a thickness of 100 nm, the doping level here being approximately constant over the entire thickness of the layer; and a metallic silver layer, with a thickness of about 15 nm, acting as anode 8, covered with an encapsulating and protective layer of SiO, with a thickness of about 80 nm.

Figure 4:
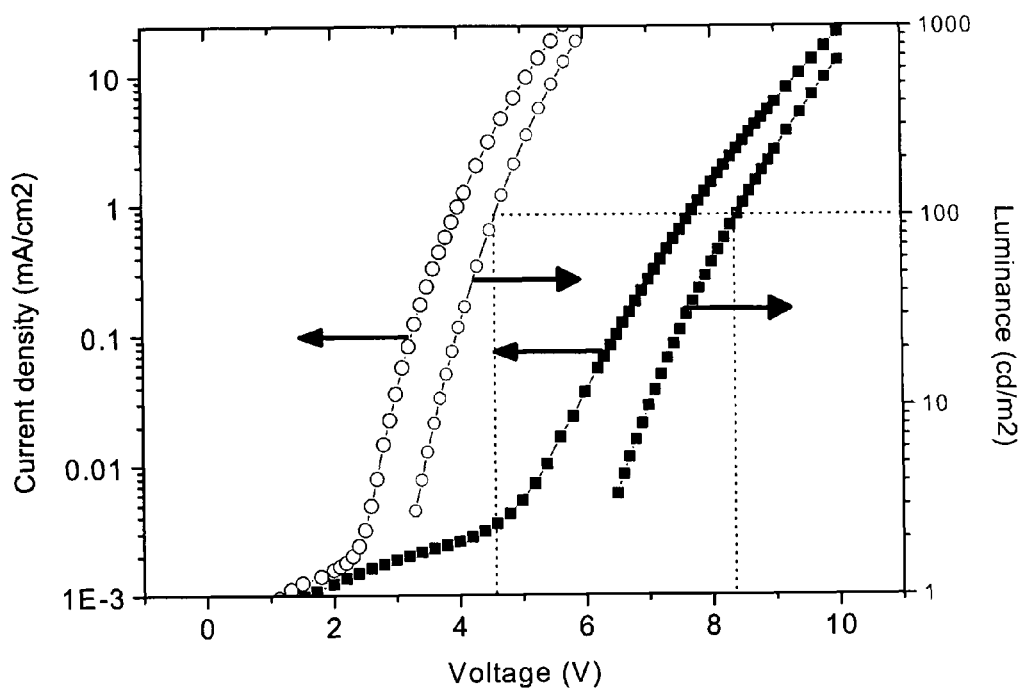
FIG. 4 shows the current-voltage characteristics of a diode as an illustrative example of the invention (open round symbols) according to the second embodiment compared with those of a diode according to the prior art (filled square symbols)

The current-voltage characteristics and luminous characteristics of the diode according to the invention thus obtained are plotted in FIG. 4 as the curve formed from open circular symbols.

For comparison, a diode identical to that which has just been described was produced with the sole difference that the donor dopant concentration in the doped lower layer 3 was kept constant.

The current-voltage characteristics and luminous characteristics of the comparative diode thus obtained have also been plotted in FIG. 4, as the curve formed from filled square symbols.

It may be seen that the doping gradient in the doped lower organic layer in contact with the cathode makes it possible for the supply voltage required to obtain a predetermined current, and therefore a predetermined illumination, to be appreciably reduced since the voltage required to obtain an illumination of 100 cd/m$^2$ goes from 8.2 V in the comparative example to only 4.3 V in the example according to the invention.

The invention claimed is:

1. An organic light emitting diode, comprising:
   a first conductor being an anode;
   a first p-doped semiconductor organic layer in electrical contact with the first conductor and doped with a first dopant having a LUMO level positioned below the HOMO level of the host material of this semiconductor organic layer;
   an electroluminescent layer over the first p-doped semiconductor organic layer;
   a second n-doped semiconductor organic layer over the electroluminescent layer and doped with a second dopant having an HOMO level positioned above the LUMO level of the host material of this semiconductor organic layer; and
   a second conductor being a cathode in electrical contact with the second doped organic layer;
   wherein one of the first and second doped semiconductor organic layers having the corresponding first p-dopant or second n-dopant comprises a dopant gradient that is increasing from a lower level in a layer of the doped semiconductor organic layer closer to the electroluminescent layer, to a higher level in a layer of the doped semiconductor organic layer closer to the corresponding first or second conductor;
   and wherein the gradient causes an average conductivity of the doped semiconductor organic layer with said gradient at least three times higher at its interface with the first or second conductor than in a core of this doped organic layer;
   thereby allowing both charge injection and transport of a first or second charge type corresponding to the first or second conductivity types in the first or second doped semiconductor organic layers, such that luminosity of the diode is increased for a given voltage.

2. The organic light emitting diode of claim 1, wherein the dopant gradient comprises a first concentration of approximately zero, such that there is a slice of zero concentration for charge blocking at said interface.

3. The organic light emitting diode of claim 1 further comprising a potential barrier at the opposite of the interface.

4. The organic light emitting diode of claim 3 wherein the potential barrier comprises a Schottky junction of greater than 0.2 eV.

5. The organic light emitting diode of claim 4, further comprising an organic blocking layer between the doped semiconductor organic layer with the dopant gradient and the electroluminescent layer which is adapted to block holes when said doped semiconductor organic layer is n-doped, or which is adapted to block electrons if said doped semiconductor organic layer is p-doped.

6. An illuminating display panel comprising an array of diodes as recited in claim 5, wherein the organic light emitting diodes of the array are supported by a common substrate.

\* \* \* \* \*